(12) United States Patent
Matsumoto (10) Patent No.: US 9,018,602 B2
(45) Date of Patent: Apr. 28, 2015

(54) CHARGED PARTICLE BEAM WRITING APPARATUS AND CHARGED PARTICLE BEAM WRITING METHOD

(71) Applicant: NuFlare Technology, Inc., Numazu-shi (JP)

(72) Inventor: Hironobu Matsumoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/961,101

(22) Filed: Aug. 7, 2013

(65) Prior Publication Data

US 2014/0077103 A1    Mar. 20, 2014

(30) Foreign Application Priority Data

Sep. 14, 2012    (JP) ................ 2012-202849

(51) Int. Cl.
   *H01J 37/317*    (2006.01)
   *H01J 37/302*    (2006.01)

(52) U.S. Cl.
   CPC ......... *H01J 37/3174* (2013.01); *H01J 37/3026* (2013.01); *H01J 37/317* (2013.01)

(58) Field of Classification Search
   CPC .. H01J 37/3174; H01J 37/317; H01J 37/3026
   USPC ...................................... 250/492.3
   See application file for complete search history.

(56) References Cited

U.S. PATENT DOCUMENTS

| | | | |
|---|---|---|---|
| 7,592,103 B2 * | 9/2009 | Kimura | 430/5 |
| 7,608,845 B2 * | 10/2009 | Abe et al. | 250/492.22 |
| 7,619,230 B2 * | 11/2009 | Suzuki et al. | 250/492.22 |
| 2007/0192757 A1 * | 8/2007 | Emi et al. | 716/20 |
| 2008/0011965 A1 * | 1/2008 | Matsukawa et al. | 250/398 |
| 2008/0184190 A1 * | 7/2008 | Yashima et al. | 716/19 |
| 2011/0031387 A1 * | 2/2011 | Nakayamada et al. | 250/252.1 |
| 2011/0046762 A1 * | 2/2011 | Yashima | 700/97 |
| 2011/0053056 A1 * | 3/2011 | Fujimura et al. | 430/5 |
| 2011/0066271 A1 * | 3/2011 | Anpo | 700/103 |
| 2011/0159436 A1 * | 6/2011 | Zable et al. | 430/296 |
| 2011/0253912 A1 * | 10/2011 | Matsumoto | 250/492.22 |
| 2012/0085940 A1 | 4/2012 | Matsumoto | |
| 2013/0134329 A1 | 5/2013 | Matsumoto | |

FOREIGN PATENT DOCUMENTS

| | | |
|---|---|---|
| JP | 2011-228503 | 11/2011 |
| JP | 2013-115303 | 6/2013 |

OTHER PUBLICATIONS

U.S. Appl. No. 14/278,177, filed May 15, 2014, Matsumoto.

* cited by examiner

*Primary Examiner* — Phillip A Johnston
*Assistant Examiner* — Sean Luck
(74) *Attorney, Agent, or Firm* — Oblon, McClelland, Maier & Neustadt, L.L.P.

(57) ABSTRACT

A charged particle beam writing apparatus includes a dose calculation unit to calculate, for each of a plurality of first small regions made by virtually dividing a writing region of a target object to be mesh-like regions each having a size larger than an influence radius of forward scattering of a charged particle beam, a dose of the charged particle beam shot in a first small region concerned of the plurality of first small regions, by using a dose formula which is different depending on a shot type classified by whether a shot figure formed by the charged particle beam is at an edge of a figure pattern or inside the figure pattern in the first small region concerned, and a writing unit to write, for each of the plurality of first small regions, the figure pattern with a dose calculated by the dose formula.

20 Claims, 9 Drawing Sheets

FIG. 10A  FIG. 10B deo × ρ e

| 0 | 0.5 | 0.8 | 0.6 |
|---|---|---|---|
| 1.6 | 1.6 | 0.4 | 0.5 |
| 0 | 0.5 | 0.8 | 0.4 |

FIG. 11A dino × ρ in

| 0 | 0 | 0 | 0 |
|---|---|---|---|
| 0 | 0.05 | 0.8 | 0 |
| 0 | 0 | 0.05 | 0 |

FIG. 11B

| 0 | 0.5 | 0.8 | 0.6 |
|---|---|---|---|
| 1.6 | 1.65 | 1.2 | 0.5 |
| 0 | 0.5 | 0.85 | 0.4 |

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2012-202849 filed on Sep. 14, 2012 in Japan, the entire contents of which are incorporated herein by reference.

BACKGROUND OF THE INVENTION

1. Field of the Invention

The present invention relates to a charged particle beam writing apparatus and a charged particle beam writing method. For example, the present invention relates to a method for calculating an irradiation time of an electron beam in electron beam writing.

2. Description of Related Art

The lithography technique that advances miniaturization of semiconductor devices is extremely important as being a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a highly precise master pattern.

Figure 13:
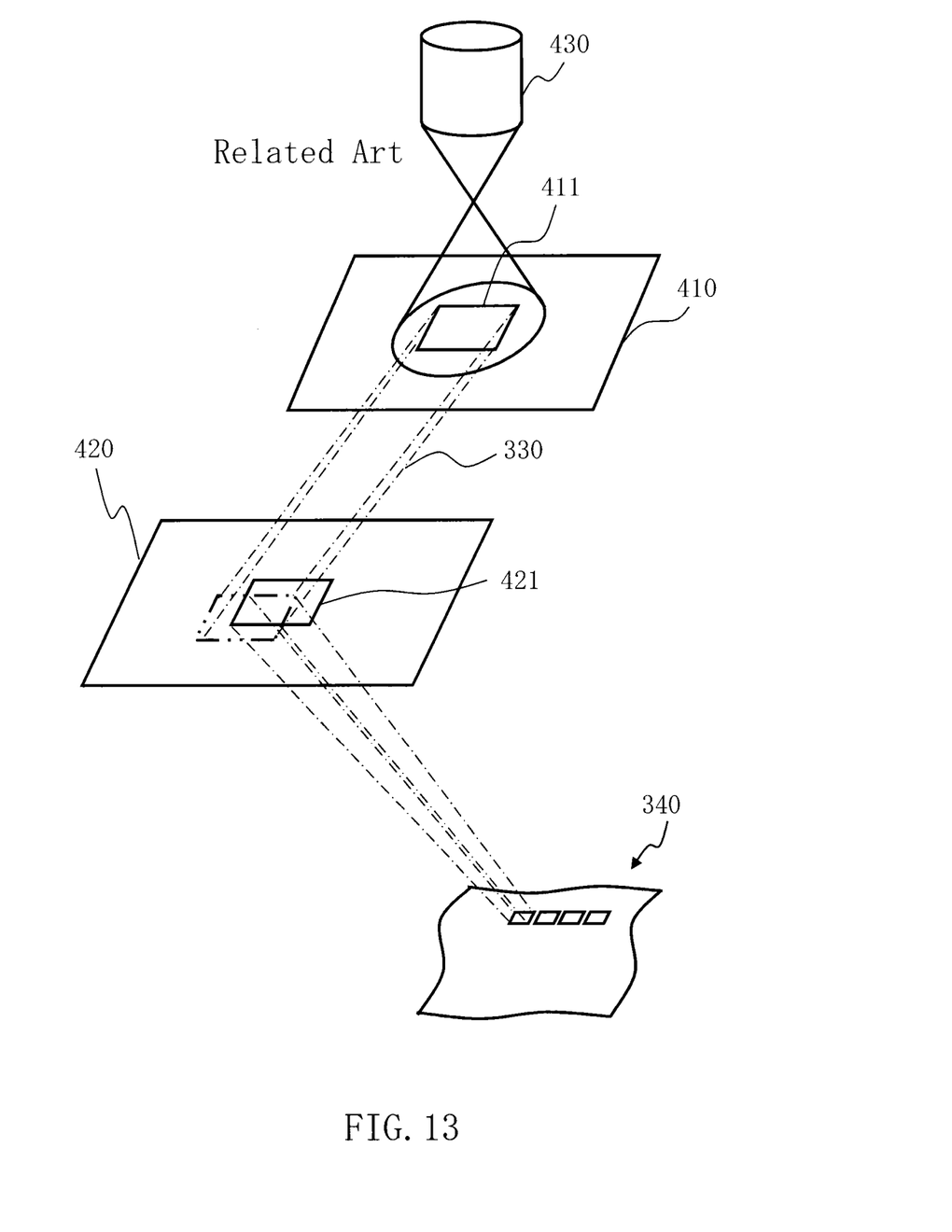
FIG. 13 is a schematic diagram explaining operations of a variable shaped electron beam writing apparatus.

FIG. 13 is a schematic diagram explaining operations of a variable shaped electron beam writing or "drawing" apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g., the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture plate 410 and the variable-shape opening 421 of the second aperture plate 420 is referred to as a variable shaped beam (VSB) method.

In the electron beam writing described above, the dose of each beam shot is set such that the value of a beam dose at the edge or "end" of a figure is to be the threshold value of a dose for resolving the resist. Generally, it is set such that about half the maximum of an irradiation energy of a shot at the figure edge reaches the threshold value. For calculating a dose, one dose formula is used irrespective of the position of irradiation. Therefore, even when writing a figure which is formed by connecting a plurality of shots, a dose of each shot is set such that about half the maximum of the irradiation energy reaches the threshold value irrespective of whether each shot concerned is at the edge of a figure or not.

On the other hand, along with recent tendency of miniaturization of patterns, the time period of performing writing by the writing apparatus becomes long. Accordingly, it is required to shorten the time period. However, since it needs to enter a calculated dose into the resist in order to properly write a pattern in accordance with the required size, the conventional method has a limit in shortening the writing time.

When performing irradiation based on an incident dose calculated by a conventional dose formula, the dose at each position of all the regions except for a figure edge and for a place on which nothing is written is larger than the threshold value of the resist. In order for each of all the doses at figure edges to be the threshold value of the resist, it is necessary to let each of all the doses in the vicinity of edges of the figure be larger than the threshold value of the resist. However, as to doses in regions sufficiently distant from the edges of the figure, it is sufficient for each of them to be about the threshold value. This subject has not been taken into consideration in the conventional method. Therefore, for example, in the case of writing a figure formed by connecting a plurality of shots, if an incident dose of a region inside the figure away from the figure edge by a sufficient distance longer than the radius of forward scattering of the beam is calculated by using the conventional method, the dose of the region is larger than the threshold value of the resist. That is, when a dose is large, the irradiation time becomes long in accordance with the dose. Thus, an excessive dose exists depending on a figure or its irradiation position, and accordingly, there is a problem of taking a writing time longer than needed because of such excessive dose.

Then, the inventor of the present invention developed a method of calculating, for each of a plurality of mesh regions made by virtually dividing the writing region of a target object, a dose of an electron beam shot in a mesh region concerned by using a dose formula selected for each mesh region from a plurality of dose formulas, and has already filed the invention (refer to Japanese Patent Application Laid-open (JP-A) No. 2011-228503) prior to the present invention. In this method according to the prior application, in order to correct a proximity effect, for example, a formula is selected for each of mesh regions made by dividing the write region into mesh regions each having a size larger than an influence radius of forward scattering. However, by further research and development by the inventor, it has been found that even a shot in a region inside a figure may be recognized to be at the edge of the figure, depending on a figure size. That is, there is a case where the method does not function sufficiently well.

Such a problem occurs when a figure size is smaller than the size of a divided mesh region. Then, consideration of making the mesh region size small is performed. However, if the size of mesh regions becomes small, the number of mesh regions increases, which causes a new problem that the computation amount becomes large.

BRIEF SUMMARY OF THE INVENTION

In accordance with one aspect of the present invention, a charged particle beam writing apparatus includes a dose calculation unit configured to calculate, for each of a plurality of first small regions made by virtually dividing a writing region of a target object to be mesh-like regions each having a size larger than an influence radius of forward scattering of a charged particle beam, a dose of the charged particle beam which is shot in a first small region concerned of the plurality of first small regions, by using a dose formula that is different depending on a shot type classified by whether a shot figure formed by a shot of the charged particle beam is at an edge of a figure pattern or inside the figure pattern in the first small region concerned, and a writing unit configured to write, for the each of the plurality of first small regions, the figure pattern by irradiating a first small region concerned with each shot of the charged particle beam with a dose calculated by the dose formula being different depending on the shot type.

In accordance with another aspect of the present invention, a charged particle beam writing method includes calculating, for each of a plurality of first small regions made by virtually dividing a writing region of a target object to be mesh-like regions each having a size larger than an influence radius of forward scattering of a charged particle beam, a dose of the charged particle beam which is shot in a first small region concerned of the plurality of first small regions, by using a dose formula that is different depending on a shot type classified by whether a shot figure formed by a shot of the charged particle beam is at an edge of a figure pattern or inside the figure pattern in the first small region concerned, and writing, for the each of the plurality of first small regions, the figure pattern by irradiating a first small region concerned with each shot of the charged particle beam with a dose calculated by the dose formula being different depending on the shot type.

DETAILED DESCRIPTION OF THE INVENTION

First Embodiment

In the following Embodiments, there will be described an apparatus and a method that can reduce an excessive dose and improve throughput of the apparatus by shortening the writing time.

Moreover, in the following Embodiments, there will be described a structure in which an electron beam is used as an example of a charged particle beam. The charged particle beam is not limited to the electron beam, and other charged particle beam, such as an ion beam, may also be used. Furthermore, a variable-shaped electron beam writing apparatus will be described as an example of a charged particle beam apparatus.

Figure 1:
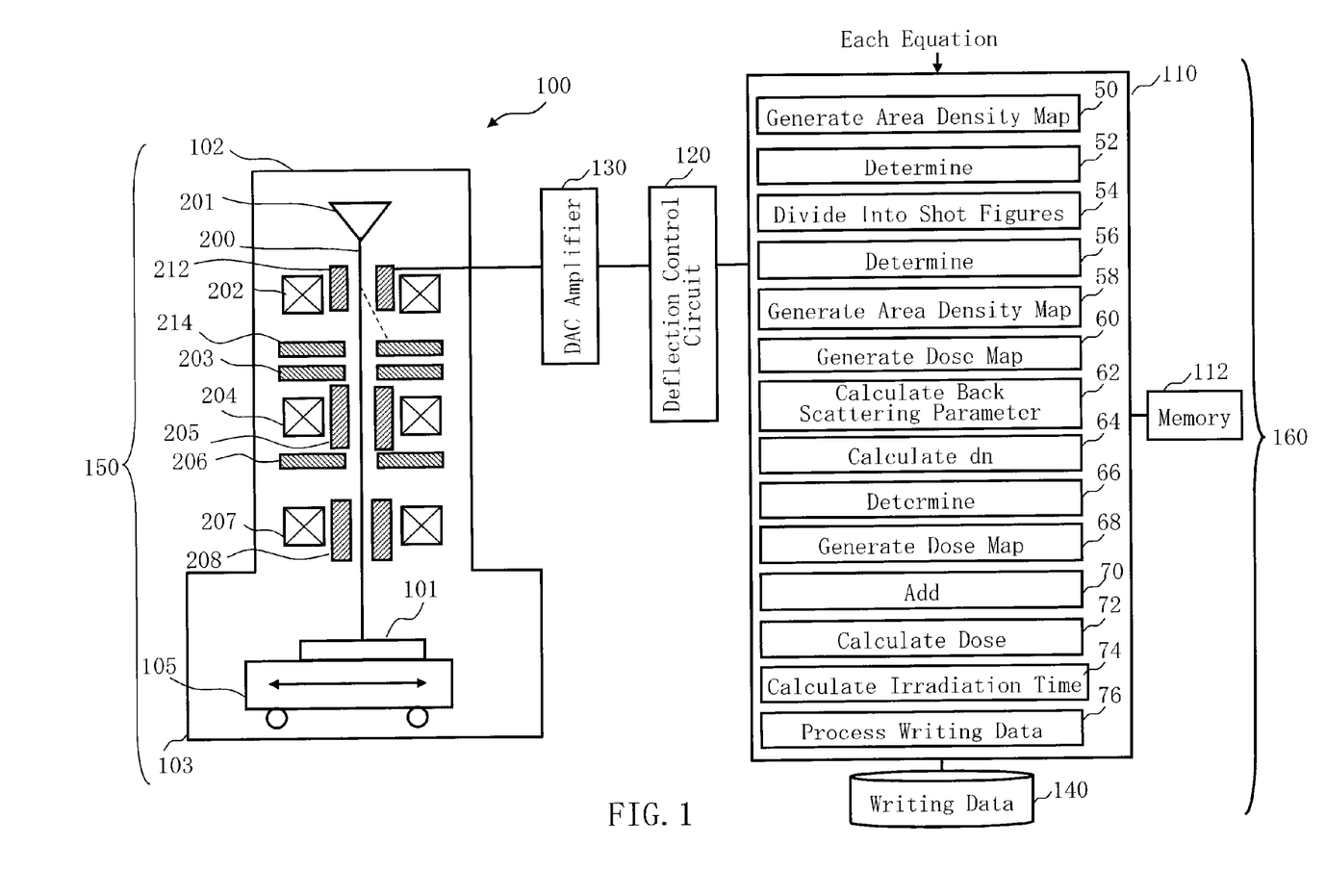
FIG. 1 is a schematic diagram showing a structure of a writing apparatus according to the first embodiment.

FIG. 1 is a schematic diagram showing a structure of a writing apparatus according to the first embodiment. In FIG. 1, a writing apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector (blanker) 212, a blanking aperture 214, a first shaping aperture 203, a projection lens 204, a deflector 205, a second shaping aperture 206, an objective lens 207, and a deflector 208. In the writing chamber 103, there is arranged an XY stage 105 which is movable at least in the x and y directions. On the XY stage 105, a target object 101 serving as a writing target is placed. The target object 101 is, for example, a mask for exposure, a silicon wafer, etc. used for manufacturing semiconductor devices. The mask is, for example, a mask blank on which a pattern has not yet been formed.

The control unit 160 includes a control computer 110, a memory 112, a deflection control circuit 120, a DAC (digital analog converter) amplifier unit 130 (deflection amplifier), and a storage device 140 such as a magnetic disk drive. The control computer 110, the memory 112, the deflection control circuit 120, and the storage device 140 are mutually connected through a bus (not shown). The deflection control circuit 120 is connected to the DAC amplifier unit 130, and this unit 130 is connected to the blanking deflector 212. The DAC amplifier unit 130 is connected to the blanking deflector 212. Writing data is input from the outside of the writing apparatus 100, and stored in the storage device 140.

A digital signal for blanking control is output from the deflection control circuit 120 to the DAC amplifier unit 130. Then, in the DAC amplifier unit 130, the digital signal is converted to an analog signal, and amplified to be applied as a deflection voltage to the blanking deflector 212. The electron beam 200 is deflected by the deflection voltage, to be formed as each beam shot.

In the control computer 110, there are arranged an area density map generation unit 50, determination units 52, 56, and 66, a shot dividing unit 54, an area density map generation unit 58, a dose map generation unit 60, a back scattering parameter calculation unit 62, a do calculation unit 64, a dose map generation unit 68, an addition unit 70, a dose calculation unit 72, an irradiation time calculation unit 74, and a writing data processing unit 76. Each function of them may be configured by software such as a program causing a computer to implement these functions or by hardware such as an electronic circuit. Alternatively, it may be configured by a combination of software and hardware. Input data necessary for the control computer 110 or a calculated result is stored in the memory 112 each time. Similarly, the deflection control circuit 120 may be configured by software such as a program causing a computer to implement the function or by hardware such as an electronic circuit. Alternatively, it may be configured by a combination of software and hardware.

FIG. 1 shows a configuration necessary for describing the first embodiment. Other configuration elements generally necessary for the writing apparatus 100 may also be included. For example, a DAC amplifier unit for the deflector 205 or 208 is of course included.

Figure 2A:
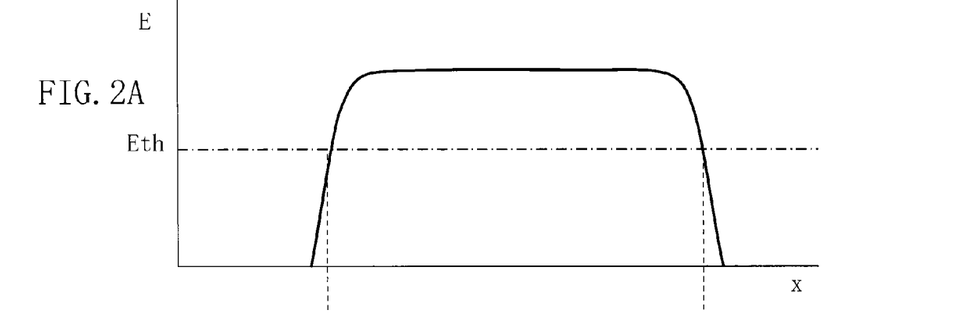
FIGS. 2A to 2D show examples of beam profiles in order to compare and explain a dose according to the first embodiment and a dose according to a conventional art.
Figures 2B, 2C:
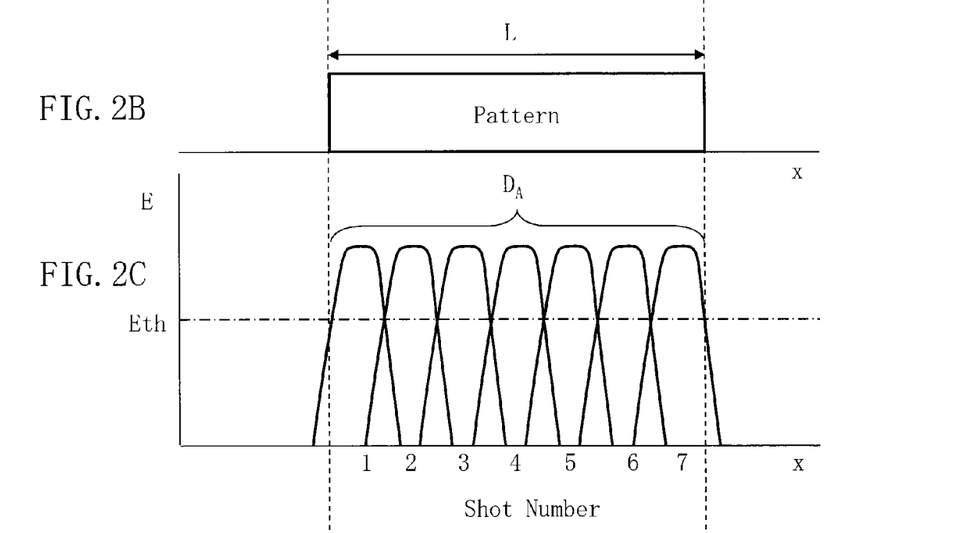
Figure 2D:
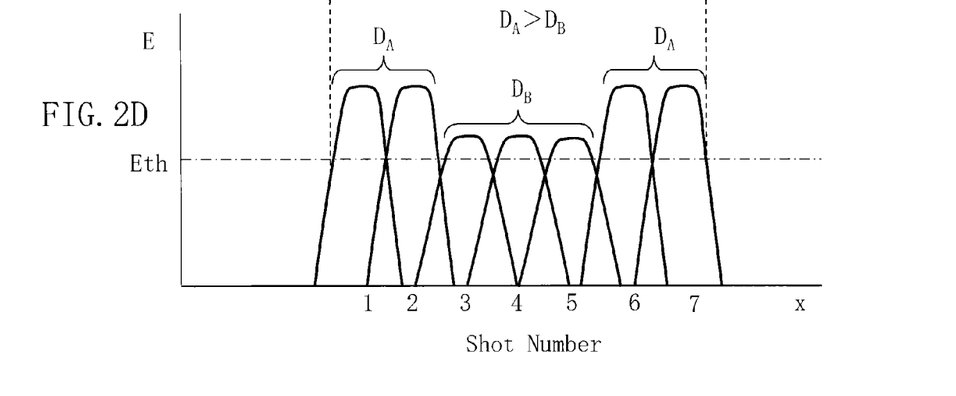

FIGS. 2A to 2D show examples of beam profiles in order to explain a dose according to the first embodiment and a dose according to a conventional art by comparing them. When writing a figure pattern having a width L as shown in FIG. 2B, the dose is set such that a threshold value Eth of the irradiation energy necessary for resolving the resist pattern is to be at the edges of the pattern as shown in FIG. 2A. For example, the threshold value Eth is set to be about 50% of the maximum value of irradiation energy. Thus, the irradiation energy increases inward from the edge of the figure, maintains the maximum value at the inner part of the figure, and decreases such that it becomes the threshold value Eth at the edge of the other side of the figure. That is, the maximum value is maintained at the inner part of the figure. Therefore, when a figure pattern is formed by connecting a plurality of shots, conventionally, as shown in FIG. 2C, the same dose $D_A$ being the maximum value is entered at each shot from the shot 1 at one figure edge to the shot 7 at the other figure edge. However, at the positions such as the shots 3 to 5 at the inner part of the figure, since dimension variation due to the effect of beam forward scattering is an ignorable level, it is ideally sufficient that the maximum value of the shot energy is the threshold value Eth of resist resolution. Then, according to the first embodiment, as shown in FIG. 2D, the dose $D_B$ at the inner part of the figure pattern is made to be less than the dose $D_A$ at the edge part. Owing to this configuration, the irradiation time of a shot can be shortened because of the reduction of the dose.

Figure 3A:
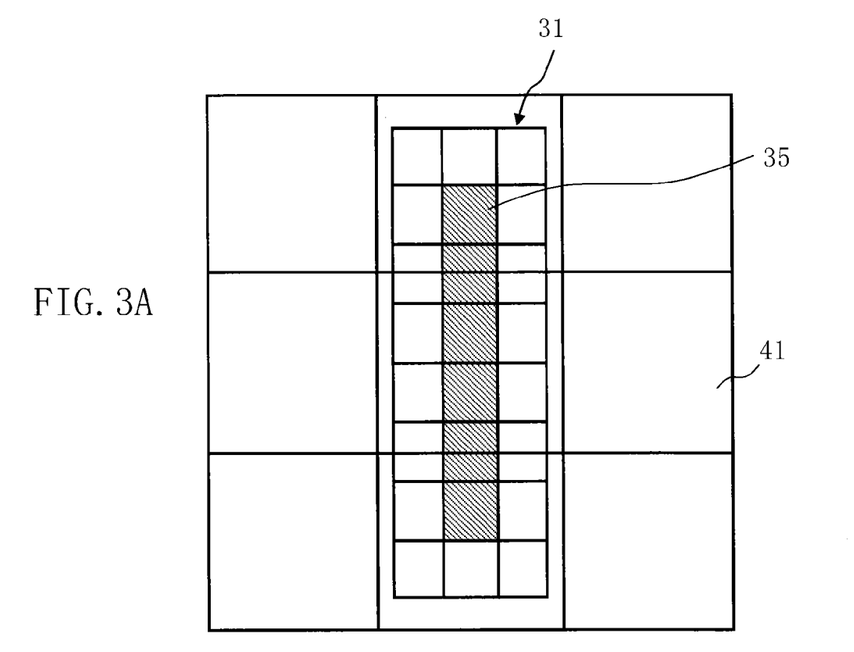
FIGS. 3A and 3B are schematic diagrams explaining a dose calculation method of a comparative example against the first embodiment.
Figure 3B:
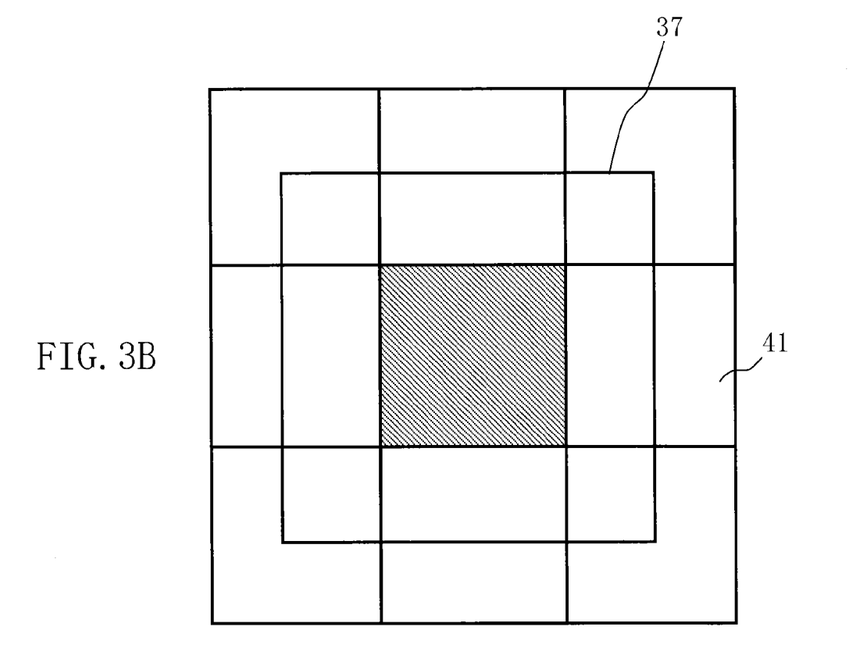

FIGS. 3A and 3B are schematic diagrams explaining a dose calculation method of a comparative example against the first embodiment. For example, let us assume that the writing region of the target object 101 is divided into a plurality of mesh regions 41 (first small region) each having a size such as 1 to 2 μms which is larger than 3σ (forward scattering radius) of a forward scattering distribution of the electron beam 200. For example, the size is about ⅒ of the influence radius of a proximity effect. The mesh region 41 is used for calculation of proximity effect correction. In the comparative example, for each mesh region 41, it is determined whether the figure arranged in a mesh region 41 concerned is at the edge of the figure pattern or inside the figure pattern, and a dose formula to be used is selected. If a figure pattern 37 serving as a writing target has a width extending over at least three mesh regions 41 as shown in FIG. 3B, it means that there is the mesh region 41 having an area density of 100% which is completely covered with the figure pattern 37. Therefore, it is possible to discriminate between a mesh region at the edge of the figure pattern and a mesh region inside the figure pattern. Accordingly, by selecting/altering a dose formula depending upon whether a mesh region is at the edge of the figure or inside the figure, a dose $D_E$ at the region inside the figure can be made smaller than a dose $D_A$ at the edge of the figure, thereby reducing the irradiation time of a shot. On the other hand, in the case where a figure pattern 31, serving as a writing target, has a width shorter than the width of the mesh region 41 as shown in FIG. 3A, it means that there is no mesh region 41 having an area density of 100% completely covered with the figure pattern 31. Therefore, it is difficult to discriminate between a mesh region at the edge of the figure and a mesh region inside the figure. Accordingly, the dose formula for a mesh region at the edge of a figure is to be used in any case irrespective of the position of each shot FIG. 35, thereby becoming difficult to make a difference between the dose of a mesh region at the edge of the figure and the dose of a mesh region inside the figure. Therefore, it is difficult to shorten the irradiation time of a shot with respect to such a figure pattern. As described above, the inventor has found out that if determining whether to be a region at the edge of a figure or a region inside a figure in each mesh region 41 whose size is larger than 3σ of a forward scattering distribution, it is sometimes difficult to select a dose formula depending upon the width of a figure pattern. Then, according to the first embodiment, a method enabling to select a dose formula irrespective of the size of a figure pattern will be described.

Figure 4:
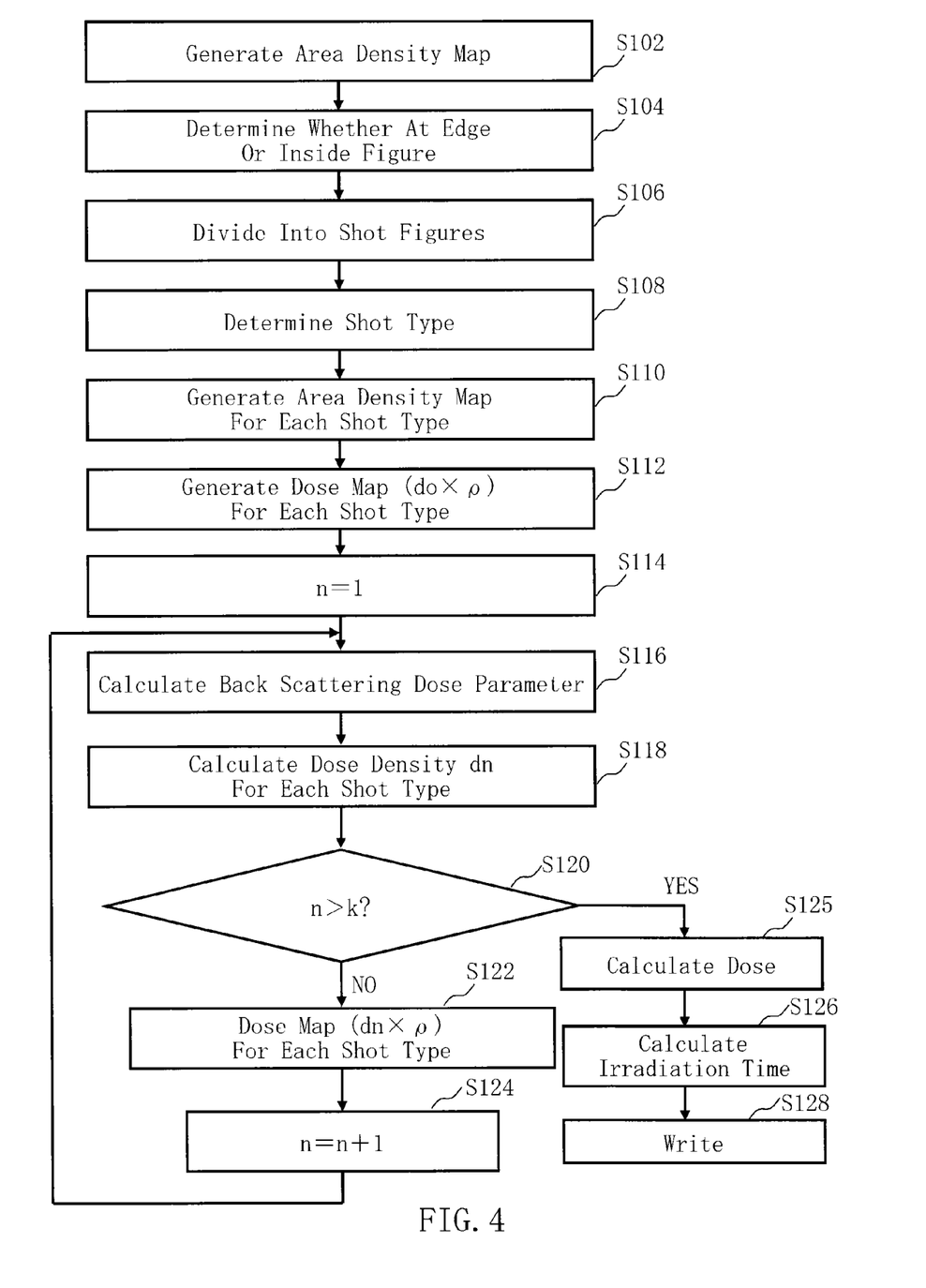
FIG. 4 is a flowchart showing main steps of a writing method according to the first embodiment.

FIG. 4 is a flowchart showing main steps of a writing method according to the first Embodiment. In FIG. 4, the writing method according to the first Embodiment executes a series of steps: an area density map generation step (S102), a determination step (S104), a shot dividing step (S106), a shot type determination step (S108), an area density map generation step (S110) for each shot type, a dose map generation step (S112) for each shot type, a setting step (S114), a back scattering dose parameter calculation step (S116), a dose coefficient calculation step (S118) for each shot type (, a determination step (S120), a dose map generation step (S122), an addition step (S124), a dose calculation step (S125), an irradiation time calculation step (S126), and a writing step (S128).

Figure 5:
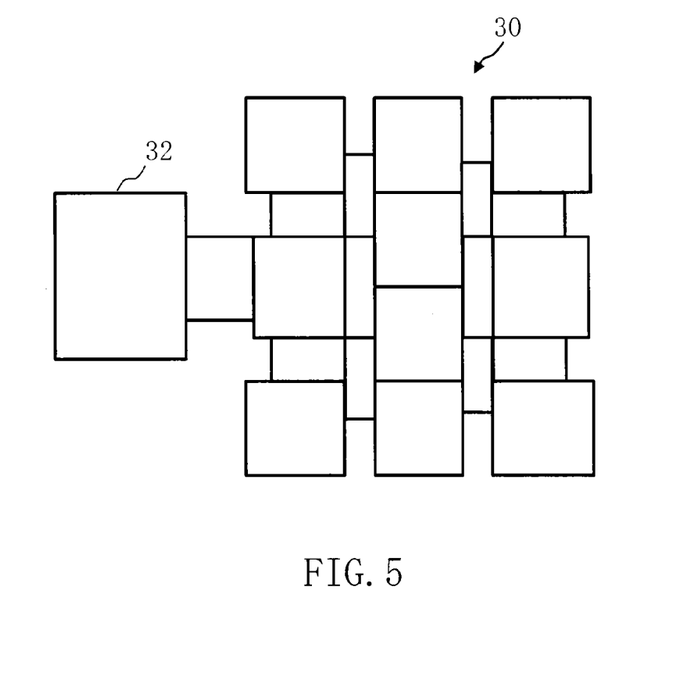
FIG. 5 shows an example of a figure pattern according to the first embodiment.

FIG. 5 shows an example of a figure pattern according to the first embodiment. A figure pattern 30 is shown as an example in FIG. 5, and hereafter, explanation will be made using the figure pattern 30. The figure pattern 30 in FIG. 5 has been divided into shot FIG. 32, and the shot dividing processing will be described in the shot dividing step (S106) later.

Figure 6:
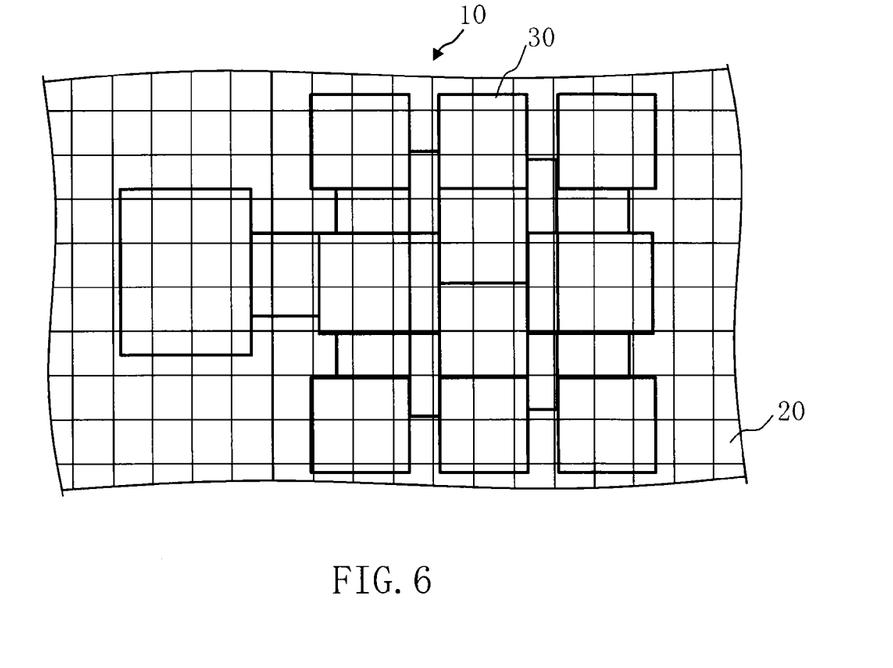
FIG. 6 shows an example of a figure pattern and an example of a shot type discrimination mesh region according to the first embodiment.

FIG. 6 shows an example of a figure pattern and an example of a shot type discrimination mesh region according to the first embodiment. First, as shown in FIG. 6, the writing data processing unit 76 virtually divides a writing region 10 of the target object 101 into mesh regions in order to define a shot type discrimination mesh region 20 (second small region). The writing data processing unit 76 reads writing data from the storage device 140, where the writing data was input from the outside and has been stored, and arranges the figure pattern 30 serving as a writing target on the shot type discrimination mesh region 20. It is preferable for the mesh size of the shot type discrimination mesh region 20 to be less than or equal to the maximum shot size used when dividing the figure pattern 30 into shot figures.

In the area density map generation step (S102), the area density map generation unit 50 calculates an area density of the arranged figure pattern 30 in each shot type discrimination mesh region 20 (second small region). Then, an area density map is generated, in which the area density of each shot type discrimination mesh region 20 is defined. The area density map generation unit 50 is an example of a first area density map generation unit. The area density map with respect to the shot type discrimination mesh is stored in the storage device 140.

Figure 7:
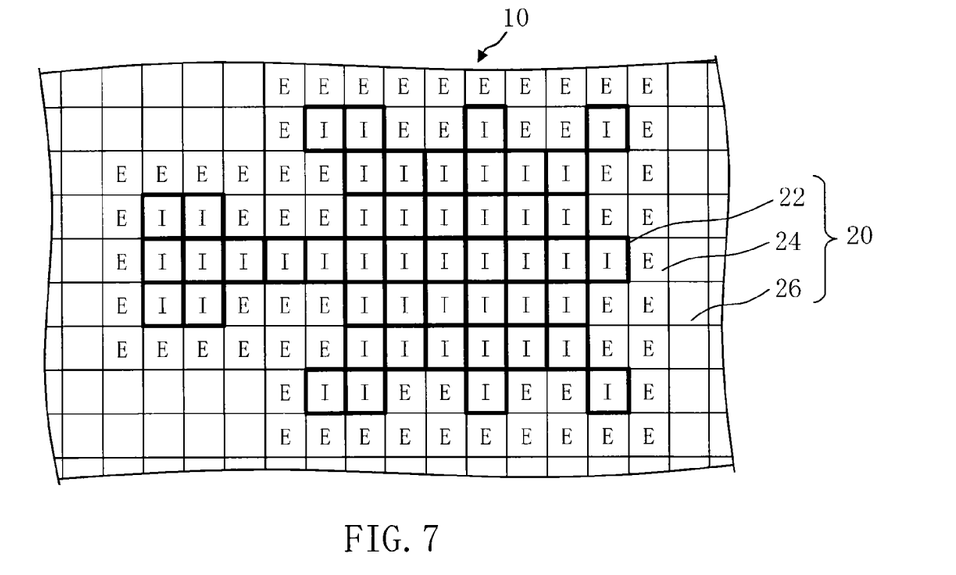
FIG. 7 shows an example of an area density state of a shot type discrimination mesh according to the first embodiment.

FIG. 7 shows an example of an area density state of the shot type discrimination mesh according to the first embodiment. In FIG. 7, "I" indicates a mesh whose area density is 100%, and "E" indicates a mesh whose area density is less than 100%.

In the determination step (S104), for each shot type discrimination mesh region 20, the determination unit 52 determines whether a shot type discrimination mesh region 20 concerned is located at the edge of a figure or inside the figure, by using the area density defined in the area density map. The determination unit 52 is an example of a small region determination unit. The determination unit 52 determines that the shot type discrimination mesh region 20 which is denoted by "I" indicating that the area density is 100% is a mesh 22 (IN) inside a figure. The determination unit 52 determines that the shot type discrimination mesh region 20 which is denoted by "E" indicating that the area density is less than 100% is a mesh 24 (END) at the edge of a figure. The determination unit 52 determines that the shot type discrimination mesh region 20 with no indication has an area density of 0% and is an empty mesh 26 in which no figure exists.

In the shot dividing step (S106), the shot dividing unit 54 divides a figure pattern into shot figures each having a size to be formed by one beam shot.

In the shot type determination step (S108), the determination unit 56 determines, for each of the shot figures, whether the shot figure concerned is at the edge of a figure or inside the figure. The determination unit 56 is an example of a shot figure determination unit.

Figure 8:
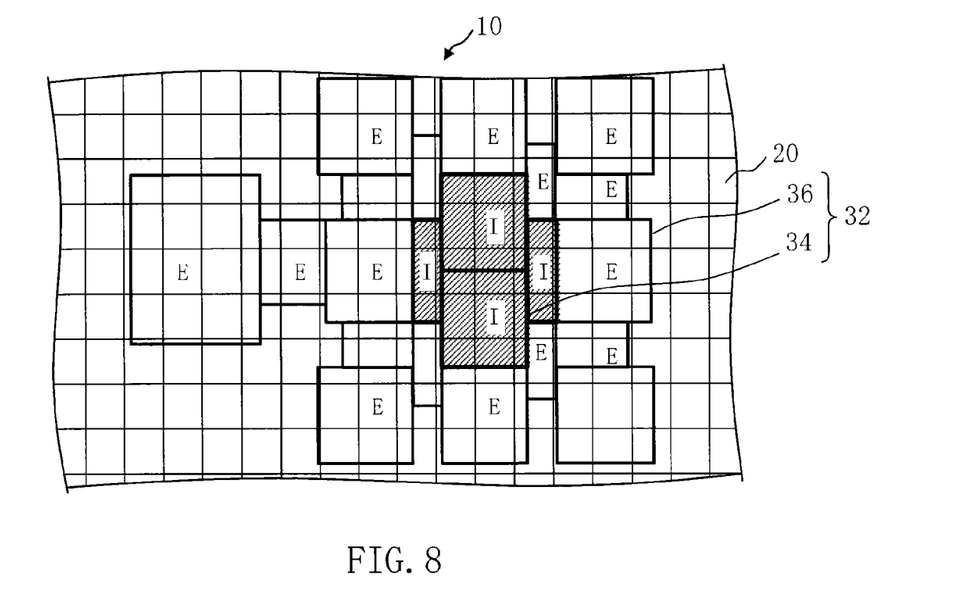
FIG. 8 shows an example of a shot type discrimination state of a shot figure according to the first embodiment.

FIG. 8 shows an example of a shot type discrimination state of a shot figure according to the first embodiment. In FIG. 8, "I" indicates a shot figure arranged only in the shot type discrimination mesh region 20 whose area density is 100%, and "E" indicates a shot figure arranged in the shot type discrimination mesh region 20 which includes the shot type discrimination mesh region 20 whose area density is less than 100%. The determination unit 56 determines the shot type of a shot FIG. 34 arranged only in the shot type discrimination mesh region 20 denoted by "I" indicating the area density of 100% to be "IN" inside a figure. The determination unit 56 determines the shot type of a shot FIG. 36 arranged in the shot type discrimination mesh region 20 including the shot type discrimination mesh region 20 denoted by "E" indicating the area density less than 100% to be "END" at the edge of a figure.

Figure 9:
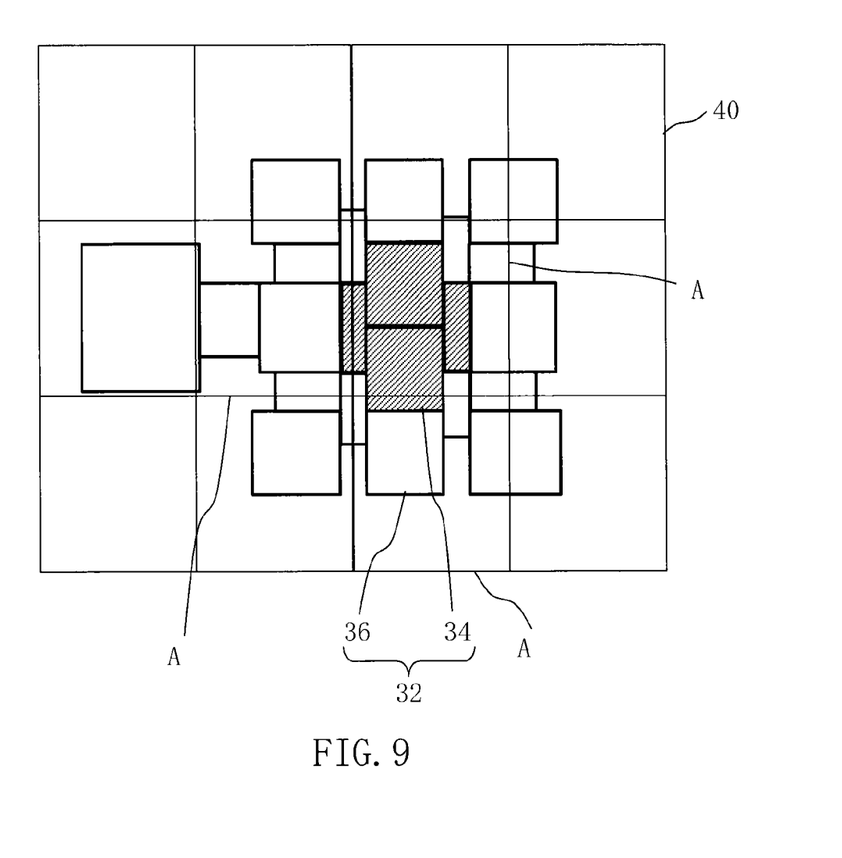
FIG. 9 shows an example of a figure pattern and an example of a proximity effect correction mesh region according to the first embodiment.

FIG. 9 shows an example of the figure pattern and an example of a proximity effect correction mesh region according to the first embodiment. As shown in FIG. 9, the writing data processing unit 76 virtually divides the writing region 10 of the target object 101 into mesh regions to define a proximity effect correction mesh region 40 (first small region). The writing data processing unit 76 arranges each shot FIG. 32, which has been made by dividing a figure pattern into shot figures, on the proximity effect correction mesh region 40. It is preferable for the mesh size of the proximity effect correction mesh region 40 to be from about 1/10 of the influence radius of a proximity effect including back scattering to about the maximum shot size, for example. In FIG. 9, for example, in the proximity effect correction mesh region 40 denoted by "A", the shot FIG. 34 (shaded part) whose shot type is "IN" being located inside a figure, and the shot FIG. 36 whose shot type is "END" being located at the edge of a figure are intermingled. Thus, in each proximity effect correction mesh region 40, the shot type of each shot figure can be classified into a shot figure at the edge of a figure pattern and a shot figure inside a figure pattern.

In the area density map generation step (S110) for each shot type, the area density map generation unit 58, for each shot type, calculates an area density of each proximity effect correction mesh region 40 when a shot figure of the shot type concerned is arranged in the proximity effect correction mesh region 40 and generates an area density map. The area density map generation unit 58 is an example of a second area density map generation unit. The area density map in a proximity effect correction mesh is stored in the storage device 140.

Figure 10A:
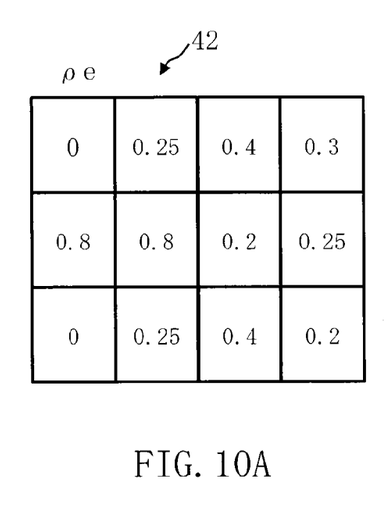
FIGS. 10A and 10B show examples of an area density map in a proximity effect correction mesh for each shot type according to the first embodiment.
Figure 10B:
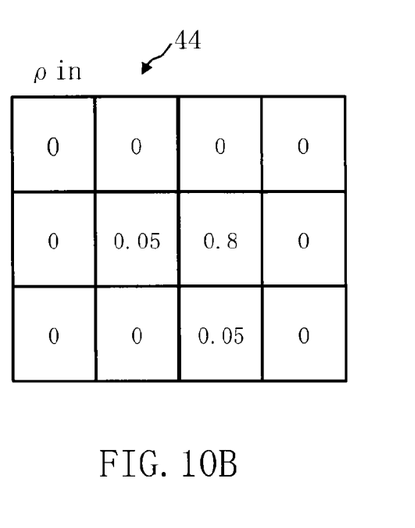

FIGS. 10A and 10B show examples of the area density map in the proximity effect correction mesh for each shot type according to the first embodiment. FIG. 10A shows an example of an area density map 42 where the shot FIG. 36 whose shot type is "END" being located at the edge of a figure is extracted and an area density "ρe" calculated for each proximity effect correction mesh region 40 is defined. FIG. 10B shows an example of an area density map 44 where the shot FIG. 34 whose shot type is "IN" being located inside a figure is extracted and an area density "ρin" calculated for each proximity effect correction mesh region 40 is defined.

In the dose map generation step (S112) for each shot type, the dose map generation unit 60 calculates, for each shot type, a dose in each proximity effect correction mesh region 40 by using the area density maps 42 and 44 of the proximity effect correction mesh. Although a dose coefficient (dose density) is obtained in order through a repeated calculation as described later according to the first embodiment, now, here, a product of a dose coefficient (dose density) and an area density which are components of the equation of repeated calculation is calculated as a dose, based on n that is the number of times of calculation being zero (n=0). The dose at the edge of a figure is defined as a product of a dose density "$de_0$" and an area density "ρe". The dose inside a figure is defined as a product of a dose density "$din_0$" and an area density "ρin". That is, a dose map is generated by using values acquired by respectively calculating $de_0 \cdot \rho e$ and $din_0 \cdot \rho in$. Here, for example, weighting being different depending on the shot type is performed based on $de_0=2.0$ and $din_0=1.0$. Since it is sufficient for a dose inside a figure to be smaller than that at the edge of the figure, setting is performed to be $de_0 > din_0$.

Figure 11A:
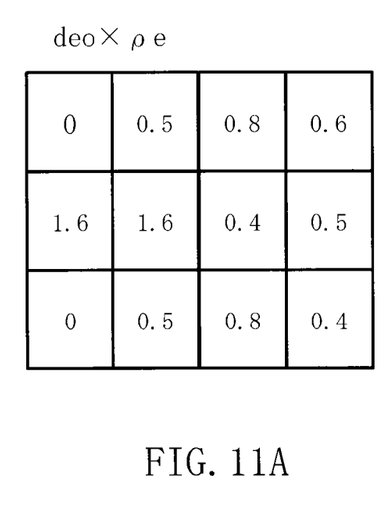
FIGS. 11A and 11B show examples of a dose map for each shot type according to the first embodiment.
Figure 11B:
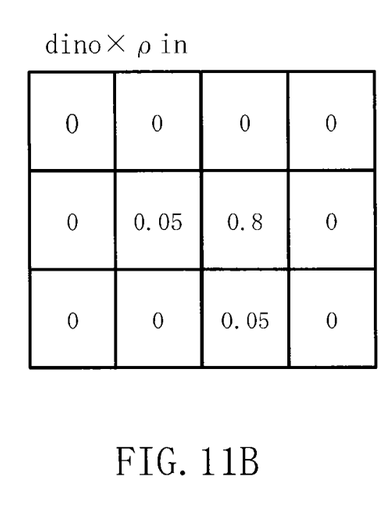

FIGS. 11A and 11B show examples of a dose map for each shot type according to the first embodiment. FIG. 11A shows an example of the dose map where the shot FIG. 36 whose shot type is "END" being located at the edge of a figure is extracted and a dose $de_0 \cdot \rho e$ calculated for each proximity effect correction mesh region 40 based on n=0 is defined. FIG. 11B shows an example of the dose map where the shot FIG. 34 whose shot type is "IN" being located inside a figure is extracted and a dose $din_0 \cdot \rho in$ calculated for each proximity effect correction mesh region 40 based on n=0 is defined.

In the setting step (S114), the writing data processing unit 76 sets n being the number of times of repeated calculation as n=1.

In the back scattering dose parameter calculation step (S116), the back scattering parameter calculation unit 62 calculates a back scattering dose distribution G·D(i) and a parameter function U(i), as back scattering dose parameters. First, the back scattering dose distribution G·D(i) is defined by the following equation (1) by using $D_n(i)$ of the following equation (2) which is defined using a distribution function g(i), a dose coefficient (dose density) $de_{n-1}(i)$, an area density ρe(i), a dose coefficient (dose density) $din_{n-1}(i)$, and an area density ρin(i). Here, i indicates a proximity effect correction mesh (proximity effect correction mesh region 40) coordinates (position), and j indicates relative coordinates from a mesh(i) for each of meshes whose center is the mesh(i).

$$(G \cdot D_{n-1})(i) = \sum_j D_{n-1}(i+j)g(j) \qquad (1)$$

$$D_n(i) = din_n(i)\rho in(i) + de_n(i)\rho e(i) \qquad (2)$$

The parameter function U(i) is defined by a sum of a parameter function Ue(i) for being located at the edge of a figure and a parameter function Uin(i) for being located inside a figure. The parameter function U(i) is defined by the following equation (3).

$$U(i) = Ue(i) + Uin(i) \qquad (3)$$

The parameter function Ue(i) for being located at the edge of a figure is defined by the following equation (4) using the distribution function g(i), a dose density $de_0(i)$, and an area density $\rho e(i)$.

$$Ue(i) = \sum_j de_0(i+j)\rho e(i+j)g(j) \quad (4)$$

The parameter function Uin(i) for being located inside a figure is defined by the following equation (5) using the distribution function g(i), a dose coefficient (dose density) $din_0(i)$, and an area density $\rho in(i)$.

$$Uin(i) = \sum_j din_0(i+j)\rho in(i+j)g(j) \quad (5)$$

When n being the number of times of calculation is one (n=1), the back scattering dose distribution G·D(i) and the parameter function U(i) are the same values. With respect to $de_0(i)\cdot\rho e(i)$ and $din_0(i)\cdot\rho in(i)$ in each equation, their corresponding mesh values in the dose map having already been generated can be used.

Since $D_{n-1}(i)=de_{n-1}(i)\,\rho e(i)+din_{n-1}(i)\rho in(i)$ as described above, it is also preferable to provide a synthesis step of synthesizing dose maps each for each shot type, between the dose map generation step (S112) and the back scattering dose parameter calculation step (S116).

Figure 12:
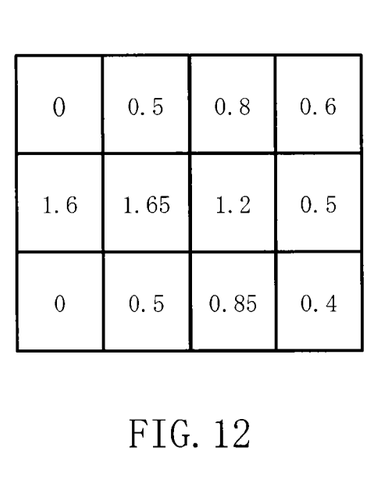
FIG. 12 shows an example of a dose synthesis map, where doses each for each shot type are synthesized, according to the first embodiment.

FIG. 12 shows an example of a dose synthesis map, where doses each for each shot type are synthesized, according to the first embodiment. FIG. 12 shows an example of a dose map in which there is defined a value obtained by adding a dose $de_0\cdot\rho e$ calculated for each proximity effect correction mesh region 40 shown in FIG. 11A and a dose $din_0\cdot\rho in$ calculated for each proximity effect correction mesh region 40 shown in FIG. 11B. By generating the dose synthesis map, the back scattering dose distribution G·D(i) and the parameter function U(i) can be calculated in a short time.

In the dose coefficient calculation step (S118) for each shot type, the do calculation unit 64 calculates a dose density $d_n(i)$ for each shot type. Here, first, a dose coefficient (dose density) $de_1(i)$ for being located at the edge of a figure, and a dose coefficient (dose density) $din_1(i)$ for being located inside a figure are calculated. The dose coefficient (dose density) $de_1(i)$ for being located at the edge of a figure is obtained by the following equation (6) using a proximity effect correction coefficient $\eta$.

$$de_1(i) = \frac{1.0+\eta}{\frac{1}{2}+\eta U(i)} \quad (6)$$

The dose coefficient (dose density) $din_1(i)$ for being located inside a figure is obtained by the following equation (7) using the proximity effect correction coefficient $\eta$.

$$din_1(i) = \frac{1.0+\eta}{1+\eta U(i)} \quad (7)$$

As described above, the contents of the equations of the dose coefficient (dose density) $de_1(i)$ for being located at the edge of a figure and the dose coefficient (dose density) $din_1(i)$ for being located inside a figure are different from each other.

In the determination step (S120), the determination unit 66 determines whether n being the number of times of repeated calculation has reached k times that has been set. When n=k, it goes to the dose calculation step (S125), and when n<k, it goes to the dose map generation step (S122).

In the dose map generation step (S122) for each shot type, the dose map generation unit 68 calculates a dose, for each shot type, in each proximity effect correction mesh region 40 by using the area density maps 42 and 44 in the proximity effect correction mesh. Here, a product of a dose density and an area density which are components of the equation of repeated calculation is calculated as a dose, based on n that is the number of times of calculation being one (n=1). The dose at the edge of a figure is defined as a product of a dose density "$de_1$" and an area density "$\rho e$". The dose inside a figure is defined as a product of a dose density "$din_1$" and an area density "$\rho in$". That is, a dose map is generated by using values obtained by respectively calculating $de_1\cdot\rho e$ and $din_1\cdot\rho in$. Then, each value of $de_1\cdot\rho e$ and $din_1\cdot\rho in$ may be used when calculating a next back scattering dose distribution G·D(i).

Since $D_{n-1}(i)=de_{n-1}(i)\rho e(i)+din_{n-1}(i)\rho in(i)$, it is also preferable to provide a synthesis step of synthesizing dose maps each for each shot type, between the dose map generation step (S122) and the back scattering dose parameter calculation step (S116). Thereby, $D_{n-1}(i)$ can be calculated beforehand, to be used when calculating a next back scattering dose distribution G·D(i).

In the addition step (S124), the addition unit 70 adds 1 to n being the number of times of repeated calculation. Then, it returns to the back scattering dose parameter calculation step (S116). The steps from the back scattering dose parameter calculation step (S116) to the addition step (S124) are repeated until it is determined to be n=k in the determination step (S120). In that case, it should be understood that since the parameter function U(i) has already been calculated and known, the calculation may be omitted in the back scattering dose parameter calculation step (S116).

In repeating each step, in the dose coefficient calculation step (S118) for each shot type, a dose density $de_n(i)$ for being located at the edge of a figure, in the case of n>=2, is obtained by the following equation (8).

$$de_n(i) = \frac{\eta\left\{de_{n-1}(i)U(i)-\sum_j D_{n-1}(i+j)g(j)\right\}}{\frac{1}{2}+\eta U(i)} \quad (8)$$

The dose density $din_n(i)$ for being located inside a figure is obtained by the following equation (9).

$$din_n(i) = \frac{\eta\left\{din_{n-1}(i)U(i)-\sum_j D_{n-1}(i+j)g(j)\right\}}{1+\eta U(i)} \quad (9)$$

As described above, the contents of the equations of the dose density $de_n(i)$ for being located at the edge of a figure and the dose density $din_n(i)$ for being located inside a figure are different from each other. In addition, values having been obtained by the equations (1) and (3) may be used when calculating the equations (8) and (9). Thereby, the calculation time can be accelerated.

By performing as described above, dose coefficients (dose densities) $de_1(i), de_2(i), \ldots, de_k(i)$ for being located at the edge of a figure, and dose coefficients (dose densities) $din_1(i), din_2(i), \ldots, din_k(i)$ for being located inside a figure can be obtained for each proximity effect correction mesh region 40.

After having been determined to be n=k in the determination step (S120), it goes to the dose calculation step (S125).

In dose calculation step (S125), for each proximity effect correction mesh region 40, the dose calculation unit 72 calculates a dose of each electron beam shot in a proximity effect correction mesh region 40 concerned, by using a dose formula which is different depending on the shot type classified by whether a shot figure formed by a shot of each electron beam 200 is at the edge of a figure pattern or inside the figure pattern in the proximity effect correction mesh region 40 concerned. Specifically, a dose De(i) and a dose Din(i) for each proximity effect correction mesh region 40 are calculated by using dose coefficients (dose densities) $de_1(i), de_2(i), \ldots, de_k(i)$ for being located at the edge of a figure and dose coefficients (dose densities) $din_1(i), din_2(i), \ldots, din_k(i)$ for being located inside a figure, for each proximity effect correction mesh region 40, which have already been obtained by using dose formulas being different depending on the shot type. The dose De(i) for being located at the edge of a figure can be defined by the following equation (10) using a base dose $D_0$.

$$De(i) = D_0 \lim_{k \to \infty} \sum_{n=1}^{k} de_n(i) \tag{10}$$

As shown in the equation (10), the dose calculation unit 72 calculates a dose De(i) for a shot figure at the edge of a figure, by using a sum of a plurality of dose coefficients (dose densities) for being located at the edge of the figure obtained through the repeated calculation described above. The dose Din(i) for a shot figure inside a figure is obtained by the following equation (11) using the base dose $D_0$.

$$Din(i) = D_0 \lim_{k \to \infty} \sum_{n=1}^{k} din_n(i) \tag{11}$$

As shown in the equation (11), the dose calculation unit 72 calculates a dose Din(i) for a shot figure inside a figure by using a sum of a plurality of dose coefficients (dose densities) for being located inside a figure obtained through the repeated calculation described above. It is also preferable to multiply other correction coefficient with respect to each dose if needed.

In the irradiation time calculation step (S126), for each proximity effect correction mesh region 40, the irradiation time calculation unit 74 calculates an irradiation time "te" for being located at the edge of a figure and an irradiation time "tin" for being located inside a figure, by respectively dividing the obtained dose De(i) for being located at the edge of a figure and the obtained dose Din(i) for being located inside a figure by a current density J of the electron beam. Calculated irradiation time "te" for a shot figure at the edge of a figure and calculated irradiation time "tin" for a shot figure inside a figure are output to the deflection control circuit 120.

Although the dose and the irradiation time are here calculated separately, it is not limited thereto. It is also preferable to simultaneously calculate a dose and an irradiation time by including a term for calculating a dose in an irradiation time calculation. Thereby, the contents of the dose calculation step (S125) can be included in the irradiation time calculation step (S126).

In the writing step (S128), for each proximity effect correction mesh region 40, the writing unit 150 writes a figure pattern by irradiating a proximity effect correction mesh region concerned with a corresponding shot of the electron beam 200 with a dose calculated by a dose formula which is different depending on the shot type. Specifically, it operates as follows. The deflection control circuit 120 outputs a digital signal for controlling an irradiation time of each shot to the DAC amplifier unit 130. The DAC amplifier unit 130 converts the digital signal to an analog signal and amplifies it to be applied as a deflection voltage to the blanking deflector 212.

When passing through the blanking deflector 212, in the beam ON state, the electron beam 200 emitted from the electron gun assembly 201 (emission unit) is controlled by the blanking deflector 212 to pass through the blanking aperture 214, and in the beam OFF state, it is deflected by the blanking deflector 212 so that the entire beam may be blocked by the blanking aperture 214. The electron beam 200, passing through the blanking aperture 214 while changing the state from the beam OFF to the beam ON and lastly again to the beam OFF, serves as one shot of the electron beam. The blanking deflector 212 controls the direction of the passing electron beam 200 to alternately generate the beam ON state and the beam OFF state. For example, it is acceptable to apply a voltage to the blanking deflector 212 when in the beam OFF state and not to apply a voltage when in the beam ON state. The dose per shot of the electron beam 200 to irradiate the target object 101 is adjusted depending upon an irradiation time T of each shot.

As described above, each shot of the electron beam 200, which is generated by passing through the blanking deflector 212 and the blanking aperture 214, irradiates the whole of the first shaping aperture 203 having a quadrangular opening by the illumination lens 202. Here, the electron beam 200 is first shaped to be a quadrangle. Then, after having passed through the first shaping aperture 203, the electron beam 200 of the first aperture image is projected onto the second shaping aperture 206 by the projection lens 204. The first aperture image on the second shaping aperture 206 is deflected and controlled by the deflector 205 so as to change (variably shape) the shape and size of the beam. Such variable beam shaping is performed for each shot, and, usually, each shot is shaped to have a different shape and size. Then, after having passed through the second shaping aperture 206, the electron beam 200 of the second aperture image is focused by the objective lens 207, and deflected by the main deflector 208 to reach a desired position on the target object 101 placed on the XY stage 105 which moves continuously. As described above, a plurality of shots of the electron beam 200 are deflected in order by each deflector onto the target object 101 serving as a substrate.

As described above, according to the first embodiment, a dose formula can be properly used according to the figure or the position regardless of the size of a figure pattern. Therefore, it is possible to suppress a superfluous dose in a region whose area density is 100% and in which a pattern size does is not influenced by forward scattering. Consequently, the writing time can be reduced, thereby improving throughput of the apparatus.

The embodiment has been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a dose calculation unit configured to calculate, for each of a plurality of first small regions made by virtually dividing a writing region of a target object to be mesh-like regions each having a size larger than an influence radius of forward scattering of a charged particle beam, a dose of the charged particle beam which is shot in a first small region concerned of the plurality of first small regions, by using a dose formula that is different depending on a shot type classified by whether a shot figure formed by a shot of the charged particle beam is at an edge of a figure pattern or inside the figure pattern in the first small region concerned, wherein in case that a shot figure at the edge of the figure pattern and a shot figure inside the figure pattern are arranged in the same first small region, one of dose formulas is used for the shot figure at the edge of the figure pattern in the same first small region, and another one of dose formulas is used for the shot figure inside the figure pattern in the same first small region; and
a writing unit configured to write, for the each of the plurality of first small regions, the figure pattern by irradiating a first small region concerned with each shot of the charged particle beam with a dose calculated by the dose formula being different depending on the shot type.

2. The apparatus according to claim 1, further comprising:
a first area density map generation unit configured to generate a first area density map in which there is defined an area density of each of a plurality of second small regions, where the figure pattern is arranged, made by virtually dividing the writing region of the target object to be mesh-like regions each having a size smaller than the size of the each of the plurality of first small regions and smaller than a minimum shot size by which the figure pattern is divided into shot figures each being the shot figure; and
a small region determination unit configured to determine, for the each of the plurality of second small regions, whether a second small region concerned is located at the edge of the figure pattern or inside the figure pattern, by using the area density defined in the first area density map.

3. The apparatus according to claim 2, further comprising:
a second area density map generation unit configured to generate, for each the shot type, a second area density map in which there is defined an area density of the each of the plurality of first small regions, when the shot figure of a shot type concerned is located in the plurality of first small regions.

4. The apparatus according to claim 1, further comprising:
a shot figure determination unit configured to determine whether each the shot figure made by dividing the figure pattern into shot figures is at the edge of the figure pattern or inside the figure pattern.

5. The apparatus according to claim 1, further comprising:
a shot dividing unit configured to divide the figure pattern into the shot figures each having a size to be formed by one beam shot.

6. The apparatus according to claim 1, further comprising:
a dose density calculation unit configured to calculate a dose density for each the shot type.

7. The apparatus according to claim 6, wherein the dose density calculation unit calculates a dose density for being located at the edge of the figure pattern and a dose density for being located inside the figure pattern.

8. The apparatus according to claim 7, wherein the dose density calculation unit calculates, through a repeated calculation, the dose density for being located at the edge of the figure pattern and the dose density for being located inside the figure pattern.

9. The apparatus according to claim 8, wherein the dose calculation unit calculates the dose for the shot figure at the edge of the figure pattern by using a sum of a plurality of dose densities each being the dose density for being located at the edge of the figure pattern obtained through the repeated calculation.

10. The apparatus according to claim 8, wherein the dose calculation unit calculates the dose for the shot figure inside the figure pattern by using a sum of a plurality of dose densities each being the dose density for being located inside the figure pattern obtained through the repeated calculation.

11. A charged particle beam writing method comprising:
calculating, for each of a plurality of first small regions made by virtually dividing a writing region of a target object to be mesh-like regions each having a size larger than an influence radius of forward scattering of a charged particle beam, a dose of the charged particle beam which is shot in a first small region concerned of the plurality of first small regions, by using a dose formula that is different depending on a shot type classified by whether a shot figure formed by a shot of the charged particle beam is at an edge of a figure pattern or inside the figure pattern in the first small region concerned, wherein in case that a shot figure at the edge of the figure pattern and a shot figure inside the figure pattern are arranged in the same first small region, one of dose formulas is used for the shot figure at the edge of the figure pattern in the same first small region, and another one of dose formulas is used for the shot figure inside the figure pattern in the same first small region; and
writing, for the each of the plurality of first small regions, the figure pattern by irradiating a first small region concerned with each shot of the charged particle beam with a dose calculated by the dose formula being different depending on the shot type.

12. The method according to claim 11, further comprising:
generating a first area density map in which there is defined an area density of each of a plurality of second small regions, where the figure pattern is arranged, made by virtually dividing the writing region of the target object to be mesh-like regions each having a size smaller than the size of the each of the plurality of first small regions and smaller than a minimum shot size by which the figure pattern is divided into shot figures each being the shot figure; and determining, for the each of the plurality of second small regions, whether a second small region concerned is located at the edge of the figure pattern or inside the figure pattern, by using the area density defined in the first area density map.

13. The method according to claim 12, further comprising: generating, for each the shot type, a second area density map in which there is defined an area density of the each of the plurality of first small regions, when the shot figure of a shot type concerned is located in the plurality of first small regions.

14. The method according to claim 11, further comprising: determining whether each the shot figure made by dividing the figure pattern into shot figures is at the edge of the figure pattern or inside the figure pattern.

15. The method according to claim 11, further comprising: dividing the figure pattern into the shot figures each having a size to be formed by one beam shot.

16. The method according to claim 11, further comprising: calculating a dose density for each the shot type.

17. The method according to claim 16, wherein a dose density for being located at the edge of the figure pattern and a dose density for being located inside the figure pattern are calculated as the dose density.

18. The method according to claim 17, wherein the dose density for being located at the edge of the figure pattern and the dose density for being located inside the figure pattern are calculated through a repeated calculation.

19. The method according to claim 18, wherein the dose for the shot figure at the edge of the figure pattern is calculated by using a sum of a plurality of dose densities each being the dose density for being located at the edge of the figure pattern obtained through the repeated calculation.

20. The method according to claim 18, wherein the dose for the shot figure inside the figure pattern is calculated by using a sum of a plurality of dose densities each being the dose density for being located inside the figure pattern obtained through the repeated calculation.

* * * * *